United States Patent [19]

Mallard, Jr.

[11] Patent Number: 4,931,791

[45] Date of Patent: Jun. 5, 1990

[54] SHORTED-COAXIAL-CABLE DETECTOR FOR LOCAL-AREA NETWORKS

[75] Inventor: William C. Mallard, Jr., Nashua, N.H.

[73] Assignee: Digital Equipment Corporation, Maynard, Mass.

[21] Appl. No.: 67,104

[22] Filed: Jun. 25, 1987

[51] Int. Cl.$^5$ .............................................. H04Q 1/00
[52] U.S. Cl. .................... 340/825.500; 340/825.160; 324/509
[58] Field of Search ........... 340/825.5, 825.16, 825.17, 340/650, 660; 370/13; 375/36, 111; 178/69 R, 69 G; 361/42, 50, 55, 86, 88, 56, 98; 379/26, 30, 33; 324/509, 541, 524, 533, 534, 544

[56] References Cited

U.S. PATENT DOCUMENTS

| | | | |
|---|---|---|---|
| 4,038,494 | 7/1977 | Miller et al. | 375/111 |
| 4,084,070 | 4/1978 | Reed et al. | 178/69 G |
| 4,335,412 | 6/1982 | Aschwanden | 340/650 |
| 4,647,912 | 3/1987 | Bates et al. | 178/69 R |
| 4,656,471 | 4/1987 | Hanss et al. | 340/825.16 |
| 4,685,113 | 8/1987 | Hono et al. | 375/36 |
| 4,739,276 | 4/1988 | Graube | 324/534 |
| 4,752,698 | 6/1988 | Furuyama et al. | 340/825.16 |
| 4,766,386 | 8/1988 | Oliver et al. | 324/533 |
| 4,782,300 | 11/1988 | Bonaccio et al. | 340/650 |

Primary Examiner—Donald J. Yusko
Assistant Examiner—Edwin C. Holloway, III
Attorney, Agent, or Firm—Nutter, McClennen & Fish

[57] ABSTRACT

A local-area-network device (10) includes a pulse detector (40), which detects positive-voltage pulses on the coaxial cable (14) of the local-area network. Such pulses occur when normal transmission signals reach a short circuit and are reflected. Upon detecting a positive pulse, the pulse detector (40) turns off a transistor switch (Q12) so as to remove power from the receive lines (22) of a receiver (20) in the device (10). Control circuitry (18) can thus conclude, from the simultaneous absences of a receive indication and of a collision indication, that a short circuit has occurred on the line.

4 Claims, 2 Drawing Sheets

SHORTED-COAXIAL-CABLE DETECTOR FOR LOCAL-AREA NETWORKS

BACKGROUND OF THE INVENTION

The present invention is directed to devices used on local-area networks. It is directed particularly to providing such devices with means for detecting short circuits on the networks.

A local-area network is a medium of communication among a plurality of data-processing or data-communication devices. A popular type involves the use either of a single coaxial cable to which various network devices are connected or of a plurality of cable sections connected in series by repeaters. In communicating over the cable, the devices observe a "carrier sense, multiple access with collision detection" (CSMA/CD) protocol. According to the protocol, only a single device at a time is allowed to transmit information over the network. Sometimes more than one device at a time attempts to initiate transmission of an information packet, but the CSMA/CD protocol provides a mechanism by which the various devices determine which device will transmit its packet.

The various devices on a local-area network may be physically separated by large distances; they are often in separate buildings. Moreover, human control over the system may be somewhat distributed, too, in that different people may be adding and removing devices without the immediate knowledge or control of the local-area-network manager. Under such conditions, short circuits in the cable can cause considerable inconveniences.

Suppose, for instance, that a user installs a device that is defective in such a way that it shorts out the cable. A typical result is that some symptoms of a collision occur. Devices attempting to transmit accordingly stop transmission and then start again, but they keep encountering collisions. System software typically responds with messages that indicate that the devices cannot complete attempted transmissions, and network operation grinds to a halt. The person in charge of the network does not know that the failure occurred when the defective device was added, and he does not know what kind of problem is causing the failure, so he is forced to engage in a significant amount of trouble-shooting before he can identify the problem. In the interim, the network is inoperative not only on the actual shorted cable section but on the other cable sections as well. That is, the problem can be identified as a short circuit only after the network is shut down.

An object of the present invention is to reduce the difficulty that results from a short circuit in a local-area-network cable. Another object is to identify a defect as a short circuit in some circumstances even while the local-area network is still operating.

SUMMARY OF THE INVENTION

The foregoing and related objects are achieved in a network device that monitors the network cable while it is transmitting so as to detect voltage pulses of a polarity opposite that which results from normal signal transmission. Since a short circuit on the cable reflects a pulse whose polarity is opposite to that of the normal signal voltage, detection of such opposite-polarity voltage pulses enables the device to determine that the short circuit is present. It can therefore provide an indication that there is a short circuit and thereby reduce the effort needed to isolate the cause of the malfunction.

BRIEF DESCRIPTION OF THE DRAWINGS

These and further features and advantages of the present invention are described in connection with the accompanying drawings, in which.

DETAILED DESCRIPTION OF THE PREFERRED EMBODIMENT

Figure 1:
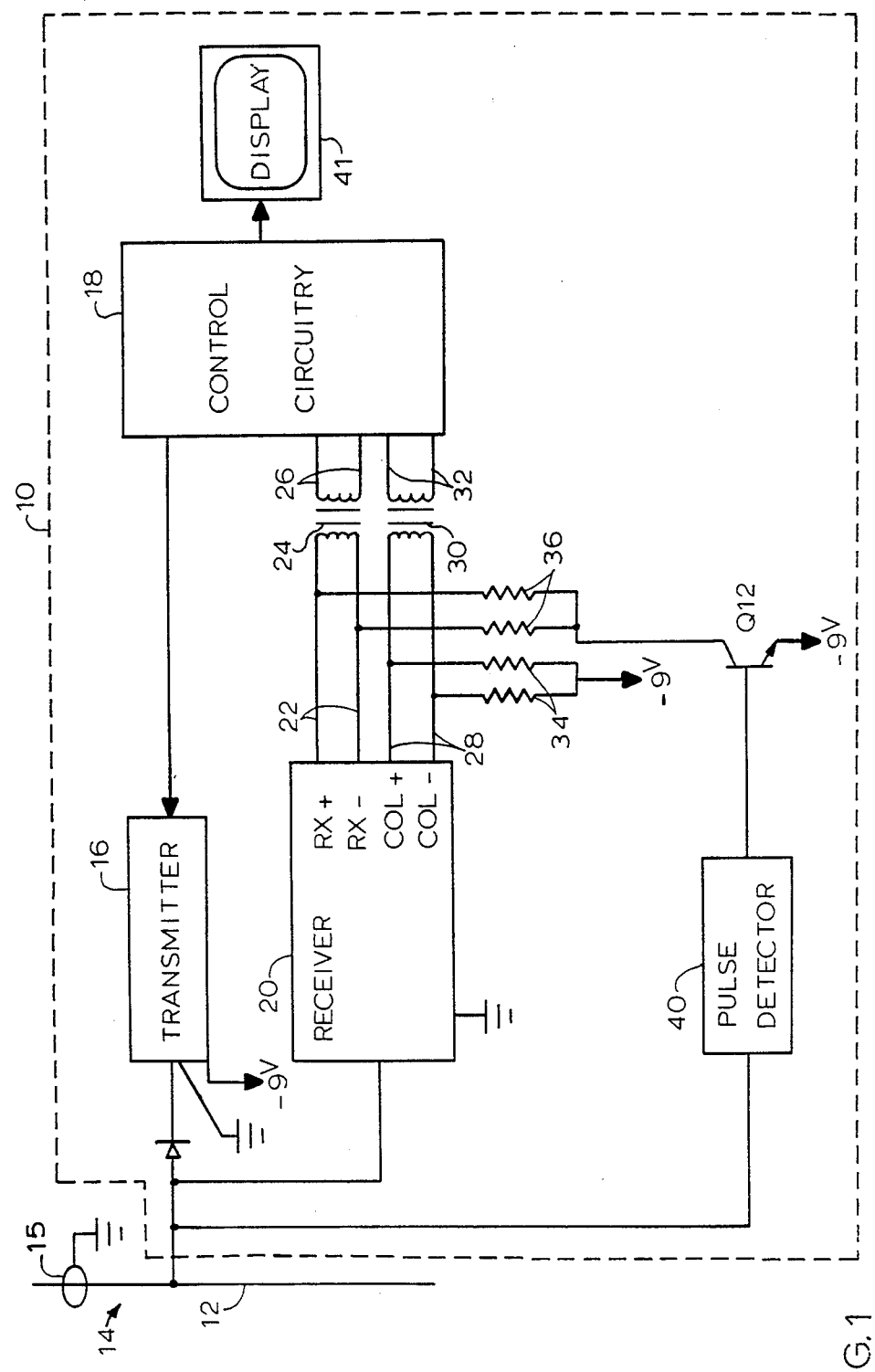
FIG. 1 is a block diagram of a local-area-network device that employs the teachings of the present invention.

FIG. 1 depicts a local-area-network device 10 connected to the center conductor 12 of a coaxial cable 14 whose outer shield 15 is grounded in the conventional manner. Each of a plurality of devices is connected to the coaxial cable 14 in substantially the same manner as is device 10. Each device includes a transmitter 16 that transmits signals along the coaxial cable 14. The signals are digital signals, and the transmitter sends the signals by drawing current in a predetermined direction through the center conductor 12. The currents are of two possible magnitudes, and the transmitter 16 is operated to transmit Manchester-encoded signals so as to result in an average current—i.e., a DC component—that is independent of the message being sent. The coaxial cable 14 is terminated in its characteristic impedance at both ends so that the message appears at the other devices in the form of a series of two negative voltage levels.

The transmitter 16 performs its function under the control of circuitry, referred to as "control circuitry" 18 in FIG. 1, that includes device-specific circuits for carrying out the specific tasks of the device 10. The control circuitry further includes circuitry that enables it to comply with the local-area-network protocol. In this regard, it is necessary for the control circuitry 18 to be informed of signals that are propagated along the coaxial cable 14, and a receiver 20 is provided for this purpose. The receiver 20 monitors the activity on the coaxial cable 12 and forwards valid packet data to the control circuitry 18. Specifically, the receive circuit responds to valid signals on cable 14 by generating a differential receive signal on receive output lines 22. This signal is coupled by a transformer 24 to corresponding further receive lines 26, which extend from receive terminals of the control circuitry 18. The receive circuit 20 and the transmitter circuit 16 are often provided together in a single transceiver integrated circuit, although separate, discrete-component circuits are also used.

In accordance with the CSMA/CD protocol, it is also necessary for the device 10 to be informed of the occurrence of collision, in which more than one device attempts to transmit signals simultaneously. When a device is transmitting, the currents that it draws are such as to cause voltages that are nominally at two levels, namely, $-0.2$ volt and $-2.05$ volt, so the average voltage on the cable 14 is $-1.1$ volt. If two or more devices are attempting to transmit simultaneously, however, the average current is greater, and the average voltage is more negative than $-1.1$ volt. While a device transmitter 10 is transmitting, its receiver 20 is simultaneously monitoring the cable to insure that the cable is actually carrying the intended signals, and it detects such excessive voltage. In response, it transmits on lines 28 a 10 MHz differential signal, which a second transformer 30 forwards to further lines 32 to notify the control circuitrY 18 that the collision is occurring. The control circuitry 18 then takes steps to recover from the collision in a conventional manner, which is not part of the present invention.

In order to transmit the receive and collision signals over lines 22 and 28, the receiver 20 must have power applied to those lines. In the case of lines 28, power is applied by connection through load resistors 34 to a −9-volt source. Accordingly, the receiver 20 can produce the collision signals whenever it detects a collision. In a conventional arrangement, the receive lines 22 would be similarly provided with power.

In accordance with the present invention, however, these lines are connected by load resistors 36 to a switched voltage source in the form of a switching transistor Q12 connected to a −9-volt source. The base of the transistor Q12 receives a signal from a pulse detector 40, which monitors the cable 14 to detect positive pulses. If a short circuit occurs on cable 14, leading edges of the voltage transitions that result from the bi-level transmissions cause positive voltage pulses, and the pulse detector 40 detects these. In response to such pulses, the pulse detector 40, which ordinarily keeps transistor Q12 turned on, turns that transistor off so as to remove the power from the receive lines 22 of the receiver 20.

The control circuitry 18 ordinarily monitors its receive lines 26 while it is transmitting. It thereby insures that the signals that it has directed the transmitter to send actually appear on the cable 14. If the pulse detector 40 turns off transistor Q12, power is removed from receive lines 22, so the control circuitry 18 does not receive an indication that the intended signals have appeared on the cable 14. Such a loss of receive signal can also result from a collision, but the control circuitry 18 is notified by lines 32 if a collision has occurred. In the absence of such a collision signal, therefore, the control circuitry 18 concludes that a short circuit is present on the cable 14, and it takes whatever action is appropriate, such as placing on a display 41 a message that a short circuit is present.

This greatly reduces the difficulties that can attend correction of the problem, since the device itself determines during its attempted transmission that the problem was a short circuit, and repair personnel can thus focus on the problem more quickly.

Figure 2:
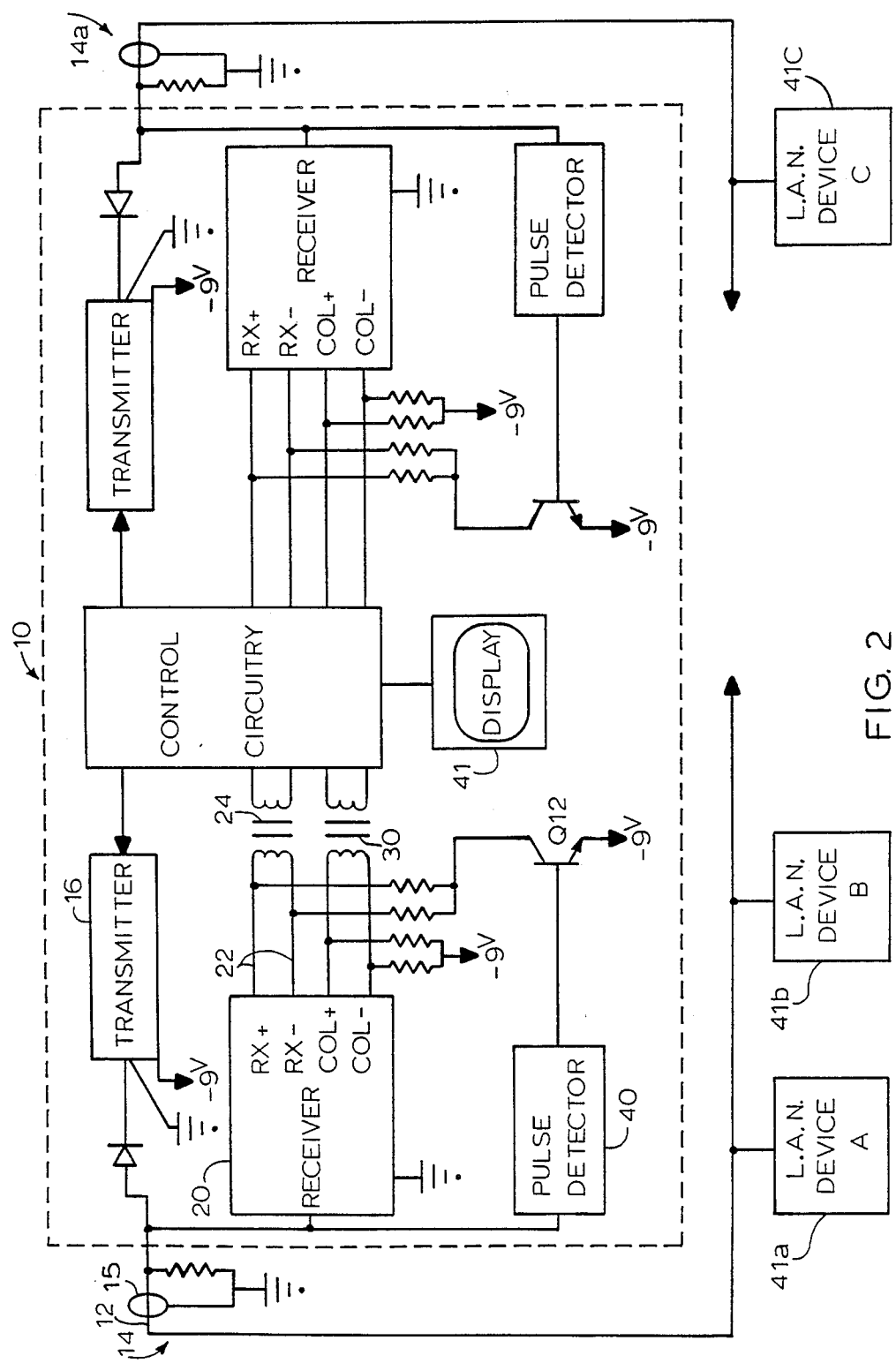
FIG. 2 is a block diagram of such a device used specifically as a repeater.

The advantages of the invention are even more apparent when it is appreciated that the device 10 may be a repeater, which, as FIG. 2 illustrates, connects cable 14 to another cable section 14a. In a system of the type depicted in FIG. 2, the repeater 10 receives signals from one cable section 14 or 14a at a time, reshapes the signal to make up for dispersion and copper loss, and forwards the reshaped signal to the other cable section. For instance, a first LAN (local-area-network) device 41a may be sending an information packet to a second device 41b. In doing so, it places signals on cable section 14. Not only does the second device 41b receive the signals but so do all other devices on cable section 14, including the repeater 10. Even though the first and second devices are on the same cable section, the repeater 10 forwards the signals from section 14 to section 14a because devices that are on cable section 14a must be prevented from transmitting packets that might be addressed to devices on cable section 14, which is busy. By forwarding signals to cable section 14a, the repeater causes the devices on that section to sense signals and thus refrain from transmitting.

The repeater 10 must also be capable of propagating collisions. For instance, suppose device 41a on cable 14 begins transmitting signals and the repeater 10 begins forwarding corresponding signals onto cable section 14a, simultaneously monitoring that section to insure that the intended signals are present. If a device 41c on cable section 14a is beginning transmission at the same time, the repeater 10 detects a collision and responds by discontinuing its transmission on cable 14a and momentarily transmitting signals on cable 14 to force a collision on that cable. Device 41c, which detects the collision caused by the repeater's transmission on cable 14a, stops transmission, as does device 41a, which detects the collision caused by the repeater's subsequent transmission on cable 14. Recovery from the collision then occurs in the usual manner.

As was described above, one way to detect a collision is to detect increased negative DC voltage on the cable. However, some repeaters also detect collisions by "carrier drop-out." As was mentioned above, the data in a transmitted packet are Manchester encoded, and the result is a signal that has a known DC component and an AC component whose power lies mostly in a frequency band about an octave wide and beginning at the reciprocal of the system bit time. For instance, the frequency band may be 10–20 MHz. This signal component can be thought of as a highly modulated carrier, and simultaneous transmission by two or more devices causes this carrier to "drop out" intermittently, i.e., start and stop instead of being present steadily as it is for a normal transmission. Therefore, the repeater's receive lines 22 do not carry a steady signal, and some repeaters detect collisions by sensing interruption on those lines while the repeater is attempting to transmit. In response to such interruption, therefore, the repeater begins the collision sequence outlined above.

Now, suppose cable section 14a develops a short circuit. If device 41a on cable section 14 attempted to transmit a packet to device 41b on the same section in the absence of the present invention, it would be prevented from doing so even though the short circuit is not on cable section 14. The reason for this is that the reflections from the short circuit on section 14a would cause intermittent carrier dropouts as though a collision were occurring, and the repeater 10 would accordingly force a collision on section 14.

According to the present invention, however, the pulse detector 40 removes power from the receive lines so that, rather than representing the intermittent dropouts that characterize a collision, they carry no signal at all and thereby represent a short circuit instead. The repeater 10 can accordingly refrain from propagating the "collision" back onto section 14, and the communication between devices 41a and b can take place despite the short circuit on section 14a. Therefore, the present invention not only simplifies troubleshooting but also enables partial operation of a local-area network while a section of its cable is shorted.

Figure 3A:
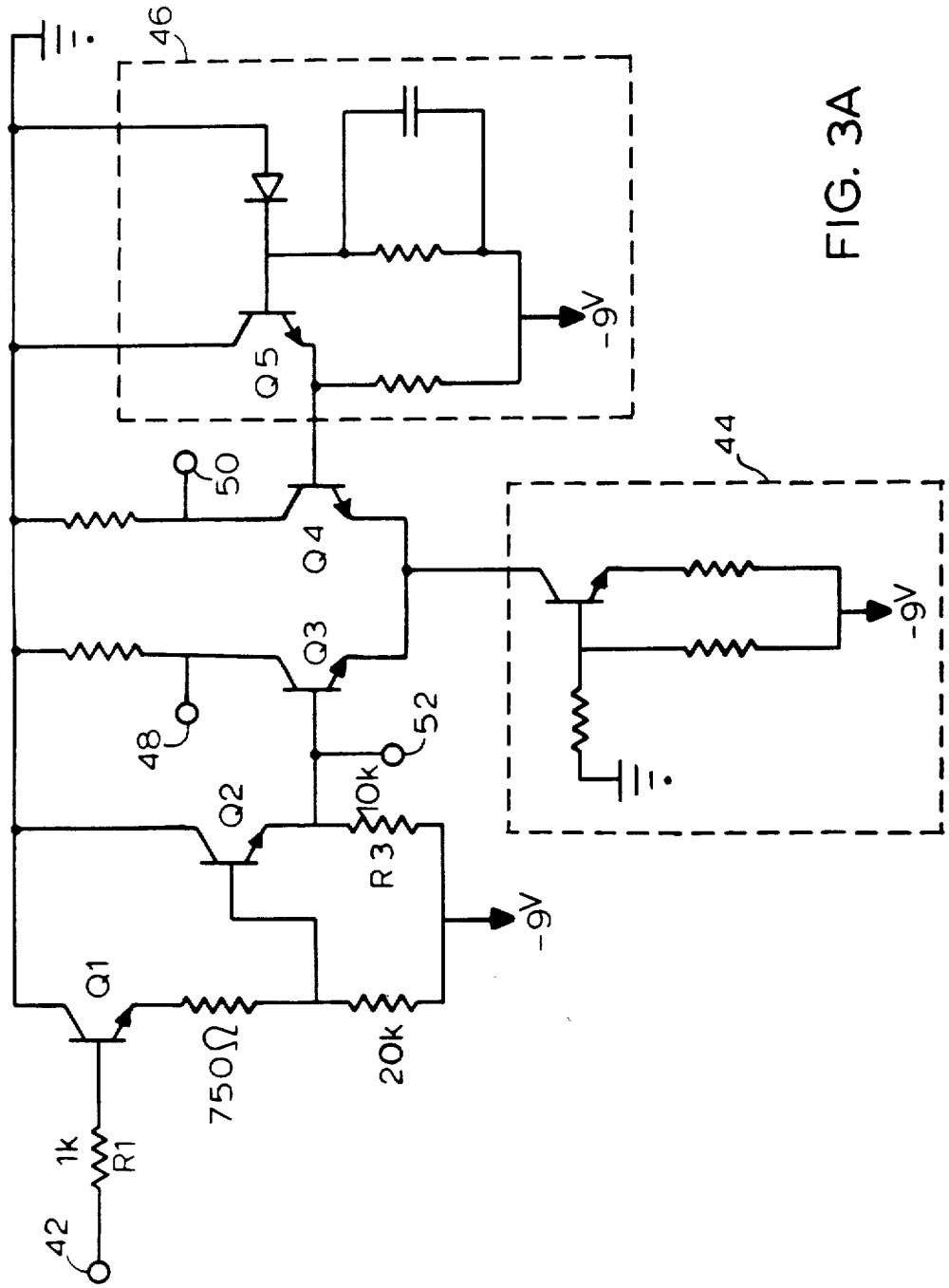
FIGS. 3A and 3B, together constitute a schematic diagram of the pulse detector employed by the local-area-network device of FIG. 1.
Figure 3B:
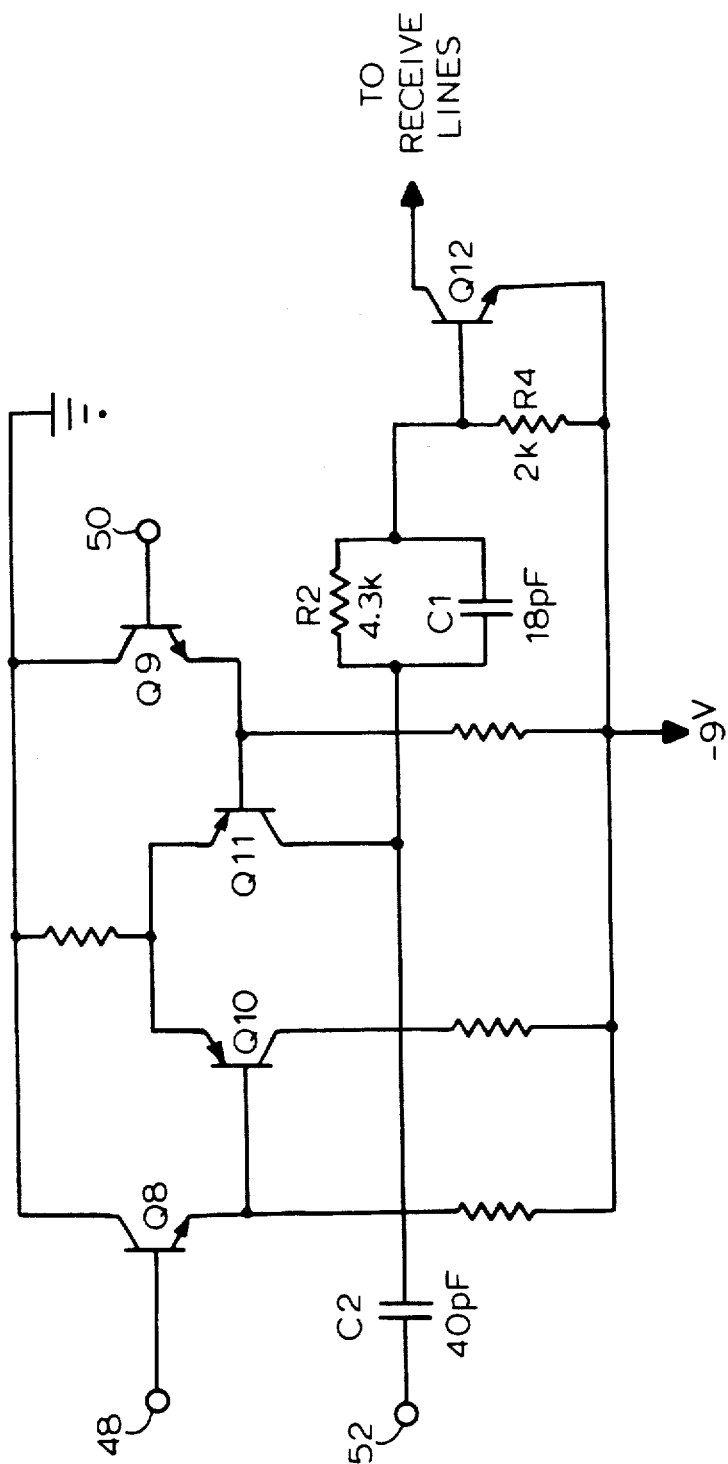

FIGS. 3A and 3B depict the pulse detector 40. The center conductor of the coaxial cable is connected to terminal 42, which applies the cable signal through a 1-kilohm resistor to the base of an input transistor Q1.

Transistor Q1 is connected in an emitter-follower configuration and drives approximately 21 kilohms of load resistance so that the pulse detector presents a high input impedance. The high impedance is needed to comply with a network requirement that a device drain less than 2.5 microamperes from the cable.

The voltage-divided output of the first emitter-follower stage is applied to the base of a second transistor Q2, which is also connected in an emitter-follower configuration. The output of the second emitter-follower stage is applied to the base of a third transistor Q3, which is one input port of a differential amplifier that includes a differential pair of transistors Q3 and Q4 and a current source 44 connected to the differential pair in a conventional differential-amplifier configuration. The differential amplifier has a very high gain and no negative feedback, and it is used as an analog comparator whose other input is the output of a −1.4 volt reference source 46. The comparator output appears across terminals 48 and 50.

In ordinary operation, the signals appearing at terminal 42 during transmission switch between nominal levels of −0.2 volt and −2.05 volt. The −0.2-volt level results in a voltage of −0.9 volt at the emitter Q1 and −2.1 volt at the emitter of Q3. Since the voltage at the base of transistor Q3 is lower by 0.7 volt than the voltage at the base of Q4, Q3 is turned off and Q4 is turned on in accordance with normal differential-amplifier operation, so the voltage at terminal 48 is less negative than that at terminal 50. This same output results when the input voltage at terminal 42 is at the lower, −2.05-volt level.

If there is a short circuit on the line, it reflects positive-voltage pulses in response to negative-going signal transitions. The amplitude of the positive pulse that can be expected depends on the distance of the short from the device 10. Even for a short circuit that is 500 meters away, however, a positive pulse on the order of 1 volt in magnitude can be expected, and the typical pulse will be approximately 20 nanoseconds in duration. When a positive 1-volt pulse appears at terminal 42, a voltage of 0.3 volt can be expected at the emitter of Q1 and a voltage of −0.7 volt at the base of Q3. Since this voltage exceeds the −1.4 volt at the base of Q4, the voltage at terminal 48 is more negative than that at terminal 50 rather than less negative, as it normally is. This output indicates the presence of a positive pulse, and it is processed further in the circuitry of FIG. 3B.

Terminals 48 and 50 are also shown in FIG. 3B, which depicts a further differential amplifier, whose inputs are the voltage levels on terminals 48 and 50. The signals on terminals 48 and 50 are applied to the bases of two emitter-follower transistors Q8 and Q9. Transistors Q8 and Q9 drop the levels of the differential outputs to levels required by pnp transistors Q10 and Q11, which form the second differential amplifier. This amplifier has a single-sided output, which appears at the collector of Q11. This output is applied through an RC network consisting of resistor R2 and capacitor C1 to the base of a further transistor Q12, whose purpose, i.e., to switch power to the receive circuit 20 on and off, was described in connection with FIG. 1.

Before the pulse-detector circuit of FIGS. 3A and 3B receives the positive pulse, terminal 48 is high and terminal 50 low, as was described above, so transistor Q11 conducts to provide an enabling voltage at the base of Q12. Transistor Q12 is therefore conducting and applying power to the receive lines 22 of the receiver circuit 20. This circuit can thus apply receive signals to the control circuitry 18.

When the positive pulse arrives, terminal 48 goes low and terminal 50 goes high so as to turn off transistor Q11 and turn on transistor Q10. This stops the current flow through transistor Q11 and so tends to turn transistor Q12 off. However, a capacitor C2 is connected between the emitter of transistor Q2 and the collector of transistor Q11 for purposes that will be explained presently. In the absence of capacitor C1, therefore, transistor Q12 would not turn off immediately; it would remain on for a period of time determined by the time constant of the series combination of resistor R2 and capacitor C2. To avoid this result, capacitor C1 is provided to act as an AC short around resistor R2 so that Q12 turns off immediately; with transistor Q12 initially turned on, the charging path for capacitors C1 and C2 consists of the capacitors C1 and C2 themselves and the low effective resistances of transistor Q2 and the base-emitter junction of transistor Q12. Accordingly, as soon as the pulse arrives, transistor Q12 switches off to remove power from the receive lines 22 and thereby prevent the control circuitry 18 from receiving an indication that the coaxial cable 14 is carrying local-area-network signals.

Once the pulse-detector circuitry detects a positive-voltage pulse, it should keep the power disconnected long enough for the next pulse to arrive if transmission is continuing. This is the purpose of capacitor C2. When the positive pulse ends, the voltage at the base of Q2 falls, but the capacitors C1 and C2 prevent an immediate corresponding drop in the Q2 emitter voltage. Since transistors Q11 and Q12 have been turned off and the drop in the voltage at the base of Q2 has caused Q2 to turn off also, the discharge paths for capacitors C1 and C2 include resistor R2, a resistor R3 in the emitter circuit of Q2, and another resistor R4 in the base circuit of Q12. The effective resistance provided by these resistors is much greater than the effective resistance of the charging circuits that charged those capacitors initially. Therefore, the voltage at the base of Q3 decreases only slowly, and transistor Q12 thus remains turned off until capacitors C1 and C2 have had time to discharge.

In accordance with Manchester encoding, a negative-going transition occurs at least once in every two bit times, so a positive pulse occurs that frequently if the coaxial cable 14 is short-circuited, and capacitors C1 and C2 are accordingly recharged that frequently. Since it takes longer than two bit times to discharge capacitors C1 and C2, power remains disconnected from the receive lines 22 so long as attempted transmission over the local-area network continues.

The invention just described constitutes a significant improvement over conventional local-area-network devices. A local-area-network device of this type provides diagnostic information that greatly aids the efforts of repair personnel. Moreover, it enables the network to keep operating in some circumstances even while a cable section is short-circuited. The present invention thus constitutes a significant advance in the art.

I claim:

1. For use in a local-area-network device adapted for connection to a local-area-network cable, the combination comprising:
   (A) a transmitter selectively operable to assume an inactive state, in which it drives no substantial current through the cable, and an active state, in which it transmits binary signals by selectively driving current through the cable at one of two predetermined magnitudes in the same direction so as to cause voltages within predetermined voltage ranges of a given polarity on the cable when the cable is not shorted; and (B) short-detection means for monitoring the local-area-network cable to detect a reversal of the voltage on the cable while the transmitter is in its active state and for generating a short-indicating signal in response to such a reversal.

2. For connection to a local-area-network cable, a local-area-network device comprising:
- (A) a transmitter selectively operable to assume an inactive state, in which it drives no substantial current through the cable, and an active state, in which it transmits binary signals by selectively driving current through the cable at one of two predetermined magnitudes in the same direction so as to cause voltages within predetermined voltage ranges of a given polarity on the cable when the cable is not shorted;
- (B) a receiver operable by application of power thereto to monitor the local-area-network cable while the transmitter is in its active state and to respond to voltages in the predetermined voltage ranges by generating receive signals, the receiver generating no receive signals when power is not applied to it, the receiver further including collision-indicating means for responding to voltages that exceed the predetermined voltage ranges by generating a collision signal;
- (C) power-source means for applying power to the receiver, the power-source means being operable by application of a control signal thereto to remove power from the receiver;
- (D) short-detection means for monitoring the local-area-network cable to detect a reversal of the voltage on the cable while the transmitter is in its active state, for generating a short-indicating signal in response to such a reversal, and for applying the short-indicating signal as the control signal to the power-source means to cause it to remove power from the receiver when the short-detection means detects a short circuit so that the absence of a receive signal during transmission is a symptom of a short circuit; and
- (E) a control circuit, connected to receive the receive and collision signals, for generating a short-circuit indication in response to the simultaneous absence of the receive and collision signals when the transmitter is in its active state.

3. A local-area-network device as defined in claim 2 wherein:
- (A) the control circuit operates the transmitter selectively to its active and inactive states and, when it operates the transmitter in its active state, operates the transmitter in predetermined bit times and causes it to change in each direction the level of current that it drives through the cable at least once every two bit times; and
- (B) the short-detection means keeps the power-source means from applying power to the receiver for at least two bit times whenever it detects a reversal of the voltage on the cable.

4. For use in a local-area-network device adapted for connection to a local-area-network cable, the combination comprising:
- (A) a transmitter selectively operable to assume an inactive state, in which it draws no substantial current through the cable, and an active state, in which it transmits binary signals by selectively driving current through the cable at one of two predetermined magnitudes in the same direction so as to cause voltages within predetermined voltage ranges of a given polarity on the cable when the cable is not shorted;
- (B) a receiver operable by application of power thereto to monitor the local-area-network cable while the transmitter is in its active state and to respond to voltages in the predetermined voltage ranges by generating receive signals, the receiver generating no receive signals when power is not applied to it;
- (C) power-source means for applying power to the receiver, the power-source means being operable by application of a control signal thereto to remove power from the receiver; and
- (D) short-detection means for monitoring the local-area-network cable to detect a reversal of the voltage on the cable while the transmitter is in its active state, for generating a short-indicating signal in response to such a reversal, and for applying the short-indicating signal as the control signal to the power-source means to cause the power-source means to remove power from the receiver when the short-detection means detects a short circuit so that the absence of a receive signal during transmission is a symptom of a short circuit.

* * * * *

UNITED STATES PATENT AND TRADEMARK OFFICE
CERTIFICATE OF CORRECTION

PATENT NO. : 4,931,791

DATED : June 5, 1990

INVENTOR(S) : William C. Mallard, Jr.

It is certified that error appears in the above-identified patent and that said Letters Patent is hereby corrected as shown below:

The sheet of drawing consisting of figs. 3A and 3B should be added as per attached page.

Signed and Sealed this

Twenty-seventh Day of October, 1992

Attest:

DOUGLAS B. COMER

Attesting Officer

Acting Commissioner of Patents and Trademarks